US005345489A

United States Patent [19]

Saitoh

[11] Patent Number: 5,345,489

[45] Date of Patent: Sep. 6, 1994

[54] TIMER CIRCUIT HAVING COMPARATOR COMPARING CONTENTS OF COUNTER AND REGISTER

[75] Inventor: Minoru Saitoh, Tokyo, Japan

[73] Assignee: NEC Corporation, Tokyo, Japan

[21] Appl. No.: 75,103

[22] Filed: Jun. 11, 1993

[30] Foreign Application Priority Data

Jun. 16, 1992 [JP] Japan ..................................... 156607

[51] Int. Cl.[5] ............................................. H03K 21/40

[52] U.S. Cl. ......................................... 377/39; 377/51

[58] Field of Search .................................... 377/39, 51

[56] References Cited

U.S. PATENT DOCUMENTS 4,566,111 1/1986 Tanagawa ............................. 377/39

4,809,221 2/1989 Magliocco et al. .................... 377/39

5,029,272 7/1991 Fourcroy et al. ...................... 377/39

*Primary Examiner*—Margaret R. Wambach

*Attorney, Agent, or Firm*—Whitham, Curtis, Whitham & McGinn

[57] ABSTRACT

A timer circuit is disclosed which includes a counter counting a clock signal, a register temporarily storing data, and a comparator comparing a count value of the counter with the data stored in the register and producing a signal when the count value of the counter reaches the value represented by the data stored in the register. Further provided in the timer circuit are detection circuit detecting the value of the data stored in the register and producing a detection signal when the register is written with data indicative of a value that is equal to an initial value of the counter and a circuit responding to the detection circuit to cause the register to change the value of the data stored therein to another value that is different from the initial value of the counter.

8 Claims, 4 Drawing Sheets

TIMER CIRCUIT HAVING COMPARATOR COMPARING CONTENTS OF COUNTER AND REGISTER

BACKGROUND OF THE INVENTION

The present invention relates to a timer circuit and, more particularly, to a timer circuit provided as one of peripheral units of a microcomputer.

A microcomputer includes various types of peripheral units. A timer circuit is one of the peripheral units. The timer circuit counts a clock signal to issue cyclically an interrupt request to a central processing unit (CPU) of the microcomputer. The CPU suspends the program execution in response to the interrupt request and initiates an interrupt program. The cycle of the interrupt request can be set by the CPU.

More specifically, as a timer circuit according to prior art is shown in FIG. 6, the CPU (not shown}generates a read-enable signal WENS while supplying a register 60 with data indicative of the cycle period, count data DIN. In response to the signal WENS, the register 60 fetches and supplies the data DIN to a comparator 61. On the other hand, a counter 62 is counting a clock signal having a reference cycle and reset by the signal WENS through an OR gate 63. The counter 62 resumes the clock counting operation when the write-enable signal WENS disappears. The count value of the counter 62 is supplied to the comparator 61. Therefore, when the count value of the counter 62 reaches the data stored in the register 60, the comparator 61 produces an interrupt request signal INTQ. This signal INTQ resets the counter 62 through the OR gate 63. The counter thereafter resumes the clock counting operation. The cycle period of the interrupt request signal INTQ is thus controllable by the value of the count data DIN.

Although the write operation of the count data DIN into the register 60 is performed by the instruction execution by the CPU, the write-enable signal WENS happens to be produced undesirably due to the variation in a power voltage or an external noise. In this case, the counter 62 is reset to an initial value, and the register 60 fetches the count data DIN of this time. If the content of the count data DIN of this time is equal to the initial value of the counter 62, the comparator produces immediately the interrupt request signal INTQ. The CPU is shifted to execute the interrupt program. The interrupt request signal INTQ resets the counter 62 to the initial value, whereas the register 60 retains the data equal to the initial value of the counter 62. For this reason, the comparator 61 is brought into a condition of continuing to produce the interrupt request signal INTQ. The CPU is thus never released from the interrupt program routine. Such an abnormal condition may occur by a programming miss in which the content of count data to be written into the register 60 by the execution of a data write instruction is the same as the initial value of the counter 62.

SUMMARY OF THE INVENTION

It is therefore an object of the present invention to provide an improved timer circuit.

It is another object of the present invention to provide a timer circuit which can overcome such a problem that a CPU is never released from an interrupt program routine when a register is written with count data having a content equal to an initial value of a counter.

A timer circuit according to the present invention includes, in addition to a register, a comparator and a counter described above, a detection circuit detecting a content of the register and producing a detection signal representing that the register is written with data having a value equal to an initial value of the counter and a control circuit responding to the detection signal and changing the content of the register to another value that is different form the initial value of the counter.

With such a circuit construction, even if the data of the value equal to the initial value of the counter is written into the register, that state is detected and the data stored in the register is then changed to the other value. The comparator is thus prevented from continuing to produce an output signal indicative of the coincidence between the contents of the register and the counter.

BRIEF DESCRIPTION OF THE DRAWINGS

The above and other objects, advantages and features of the present invention will be more apparent from the following description taken in conjunction with accompanying drawings, in which.

DETAILED DESCRIPTION OF THE INVENTION

Figure 1:
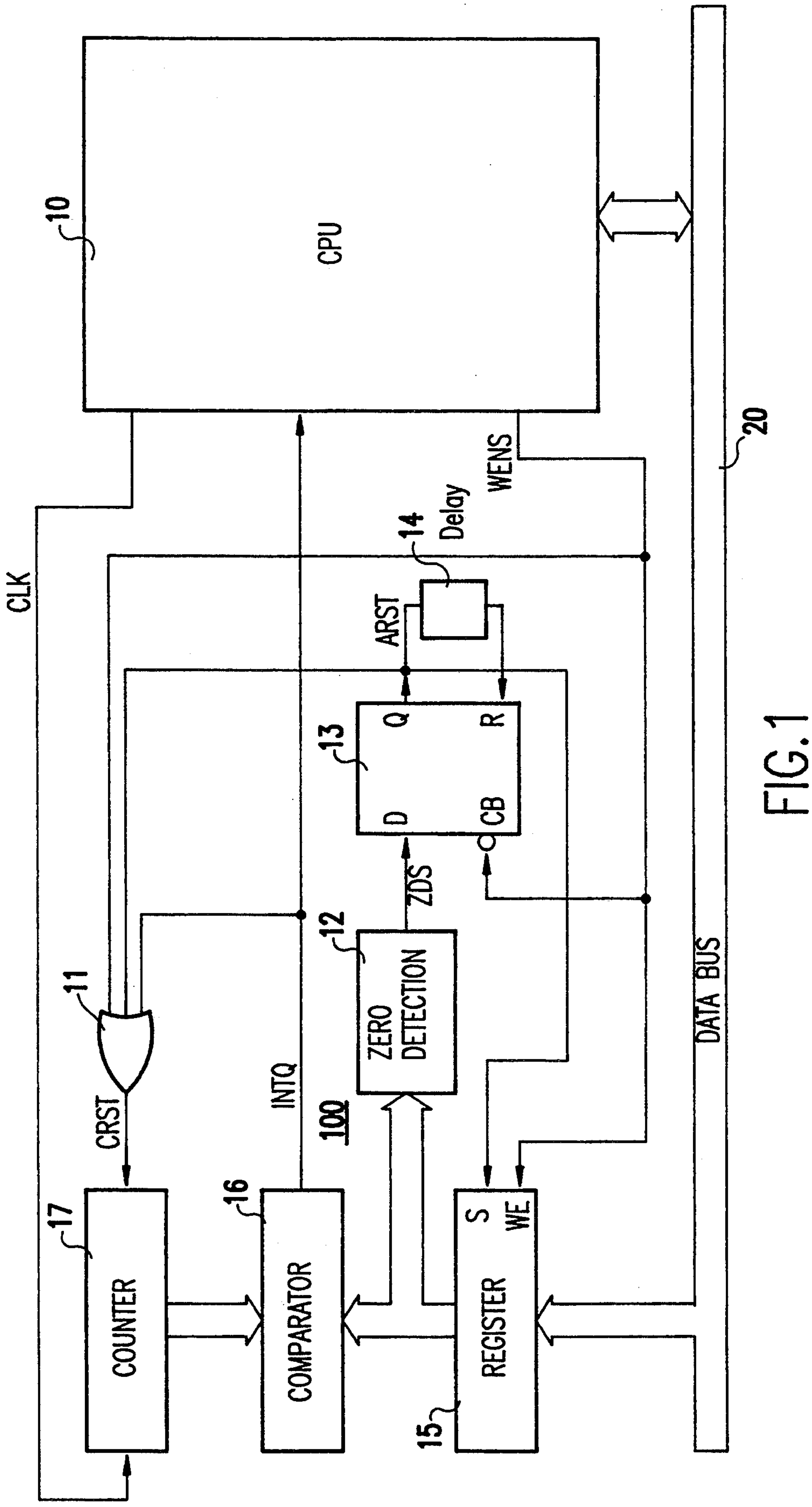
FIG. 1 is a block diagram illustrative of a microcomputer including a timer circuit according to a first embodiment of the present invention.

Referring to FIG. 1, a microcomputer includes as a peripheral unit a timer circuit 100 according to a first embodiment of the present invention. This timer circuit 100 includes a register 15 which is interconnected to a CPU 10 through a data bus 20. The CPU 10, when executing a count data write instruction, produces a write-enable signal WENS while transferring count data to the data bus 20. This signal WENS is supplied to a write control terminal WE of the register 15 and further supplied to a counter 17 as a reset signal CRST through an OR gate 11. The counter 17 receives a clock signal CLK.

The count value of the counter 17 and the count data stored in the register 15 are supplied to and compared by a comparator 16. When the count value of the counter 17 reaches the value represented by the data stored in the register 15, therefore, the comparator 16 produces and supplies an interrupt request signal INTQ to the CPU 10. This signal INTQ is further supplied to the counter 17 through the OR gate 11 as the reset signal CRST.

The data stored in the register 15 is further supplied to a zero detection circuit 12 which is provided in accordance with the present invention. In the present embodiment, since the reset value, i.e. the initial value, of the counter 17, the detection circuit 12 detects whether or not the count data of the register 15 is zero and produces a detection signal ZDS when the count data is zero. It is needless to say that the value to be detected by the detection circuit 12 is changed in accordance with the initial value of the counter 17. The output of the detection circuit 12 is supplied to a data input terminal D of a latch circuit 13 having an inverted clock terminal CB supplied with the write-enable signal WENS. The signal derived from an output terminal Q of the latch circuit 13 is supplied to the OR gate 11 and further to a set terminal S of the register 15.

Figure 2:
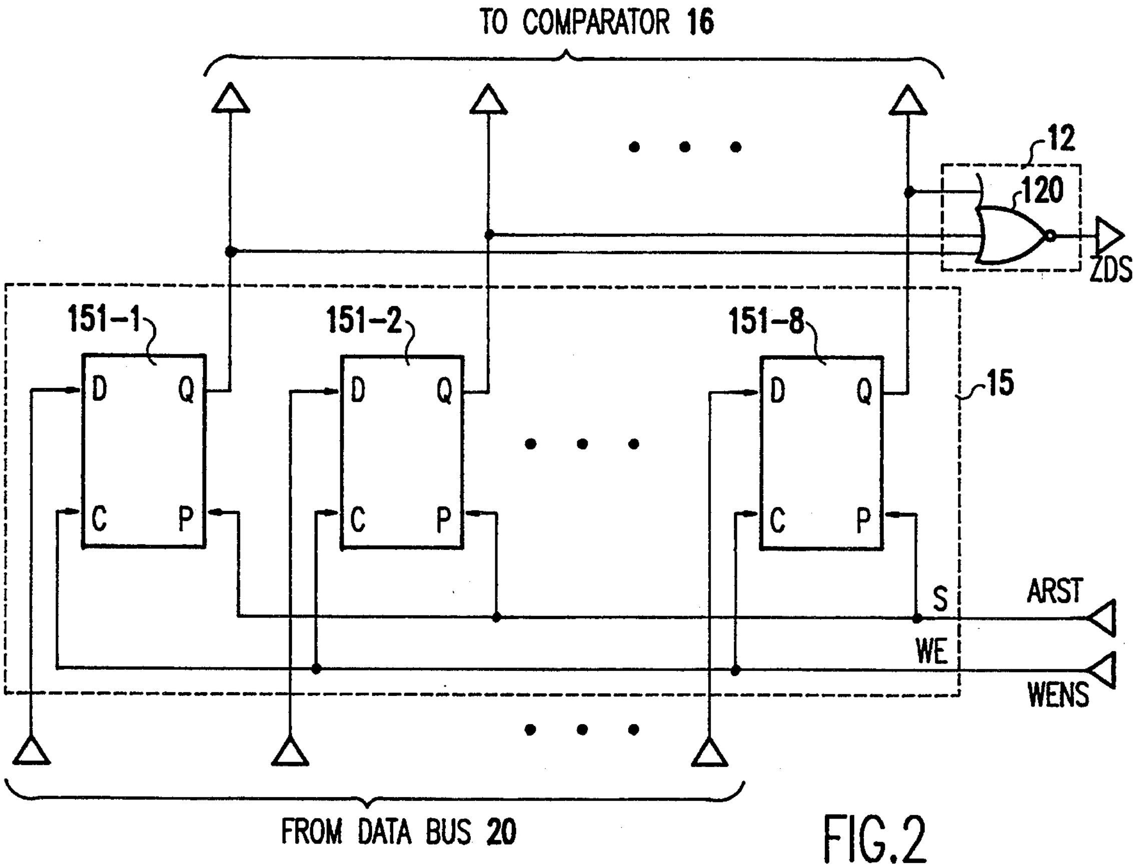
FIG. 2 is a circuit block diagram representative of a register and a zero detection circuit shown in FIG. 1.

Referring to FIG. 2, the register 15 includes eight data latch circuits 151-1 to 151--8 since the data bus 20 is of an 8-bit width. Each data latch circuit 151 includes a preset terminal P connected to the set terminal S of the register 15. The outputs of the data latch circuits 151 are supplied to a NOR gate 120 serving as the zero detection circuit 12. When the count data is zero ("00H", "H" representing a hexadecimal notation), accordingly, the NOR gate 120 produces the active high level signal ZDS.

When the active high level signal ZDS is thus produced, the latch circuit 13 (FIG. 1) generates an active high level signal ARST to change the content stored in the register 15 from "00H" to "FFH". The counter 17 is reset. This active level signal ARST is delayed by a delay circuit 14 and then resets the latch circuit 13. The delay circuit 14 may be constituted by a plurality of inverters connected in series.

Figure 3:
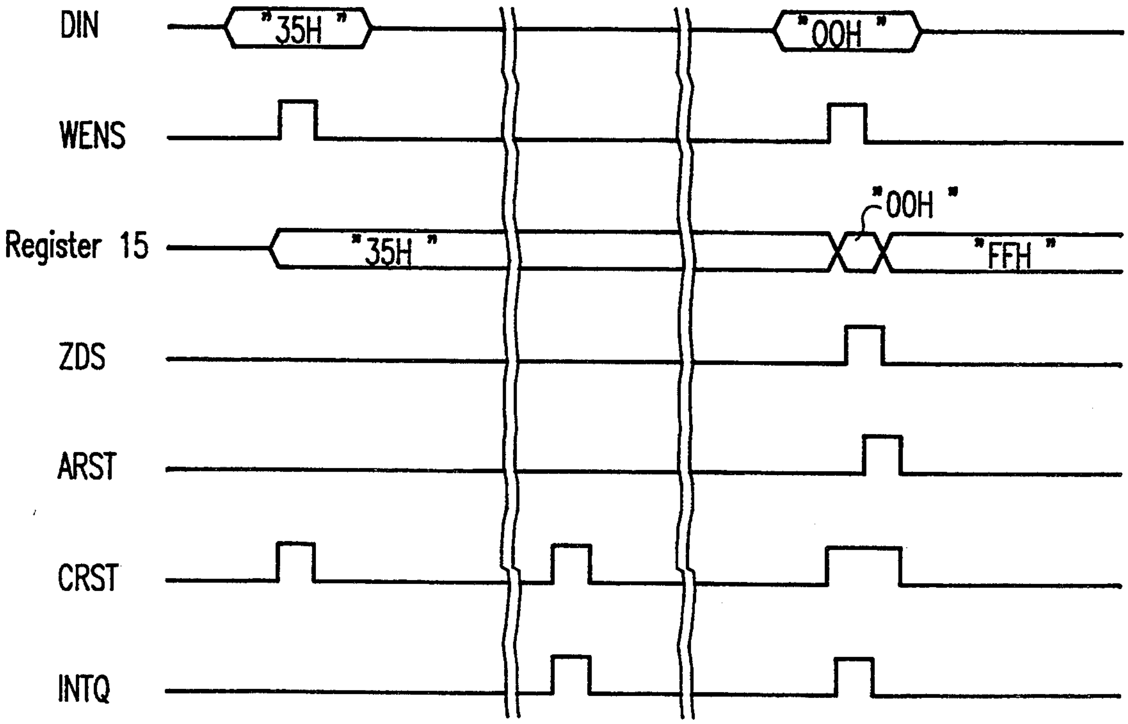
FIG. 3 is a timing chart for explaining an operation of the timer circuit shown in FIG. 1.

Assuming now that the CPU 10 executes the count data write instruction, the CPU 10 generates the write-enable signal WENS while outputting the count data of, for example, a value "35H" to the data bus 20, as shown in FIG. 3. In response to the signal WENS, the register 15 latches and supplies the count data "35H" to the comparator 16. The reset signal CRST is further generated to reset the counter 17. Since the count data is not zero, the detection signal ZDS is held at the low level, and the latch output signal ARST is also held at the low level.

The counter 17 starts counting the clock signal CLK. When the count value of the counter 17 reaches the value of "35H", the comparator generates the active high level interrupt request signal INTQ. The CPU 10 thereby suspends the current program execution and then initiates an interrupt operation. The interrupt request signal INTQ resets the counter 17 as the reset signal CRST. The comparator 16 thereby changes the signal INTQ to the low level to allow the counter 17 to resume the counting operation.

As shown in FIG. 3, if the write-enable signal WENS happens to be generated due to the power noise or the like while the data "00H" is being on the data bus 20, the register latches the data "00H", so that the detection circuit 12 produces the active high level signal ZDS. The high level of the signal ZDS is introduced in synchronism with the falling edge of the signal WENS. The signal ARST is thereby changed to the active high level to cause the register 15 to change its content from "00H" to "FFH". As a result, although the interrupt request signal INTQ is generated by the register 15 being written with the data "00H", the signal INTQ is changed to the low level immediately thereafter. The CPU 10 is thereby released from the interrupt operation.

Figure 4:
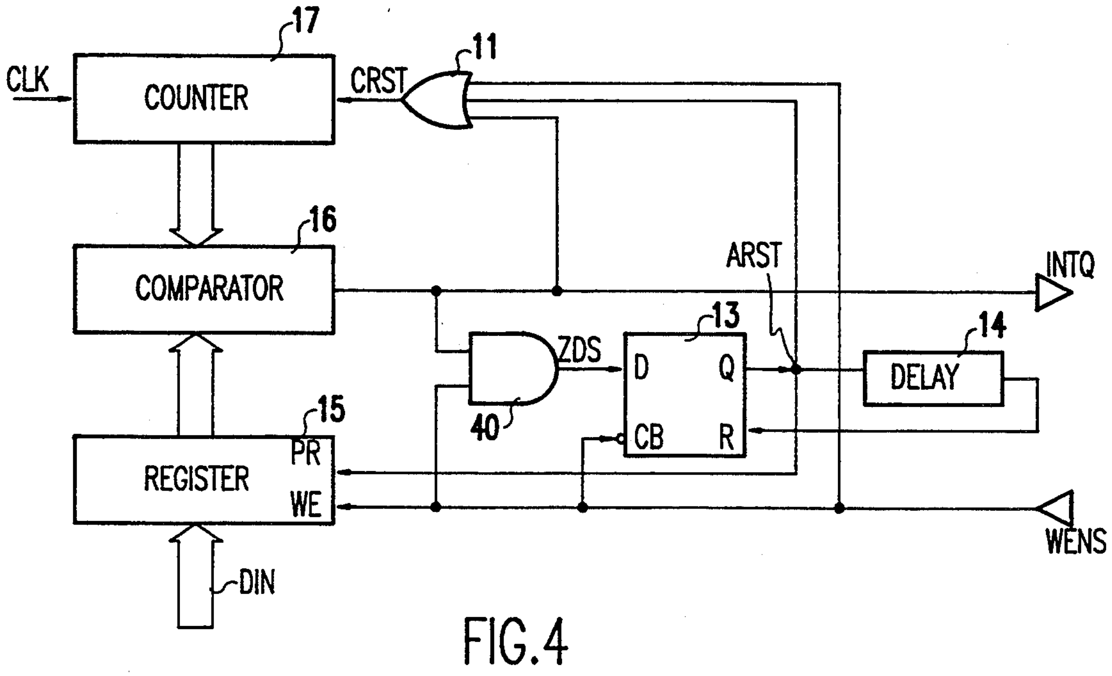
FIG. 4 is a block diagram illustrative of a timer circuit according to a second embodiment of the present invention.
Figure 6:
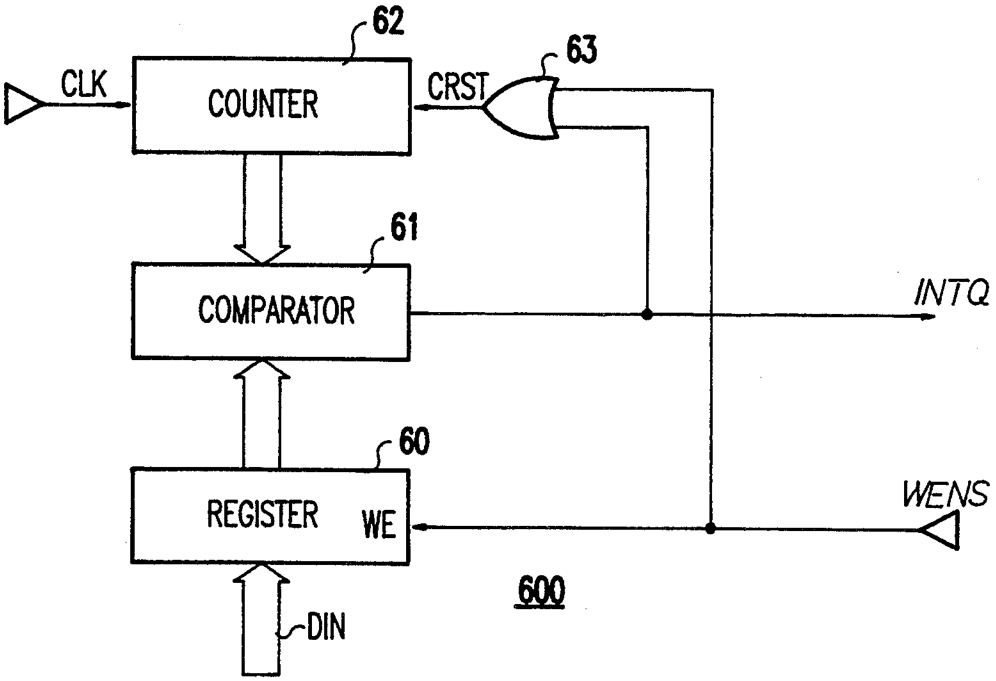
FIG.6 PRIOR ART
FIG. 6 is a block diagram illustrative of a timer circuit according to prior art.

Since the comparator 16 generates the interrupt request signal INTQ when the data "00H" is written into the register 15, this signal INTQ can be utilized as the zero detection signal ZDS. A circuit construction for this purpose is shown in FIG. 4 as a second embodiment of the present invention, in which the same constituents as those shown in FIG. 1 are denoted by the same reference numerals to omit the further description thereof. In this embodiment, an AND gate 40 is provided to receive the interrupt request signal INTQ and the write-enable signal WENS. The output signal of the AND gate 40 is used as the zero detection signal ZDS. Accordingly, only when the cont data of "00H" is written into the register 15, the AND gate 40 generates the active high level detection signal ZDS. The detection circuit 12 shown in FIG. 1 (the NOR gate 120 in FIG. 2) is thus omitted in this embodiment.

Figure 5:
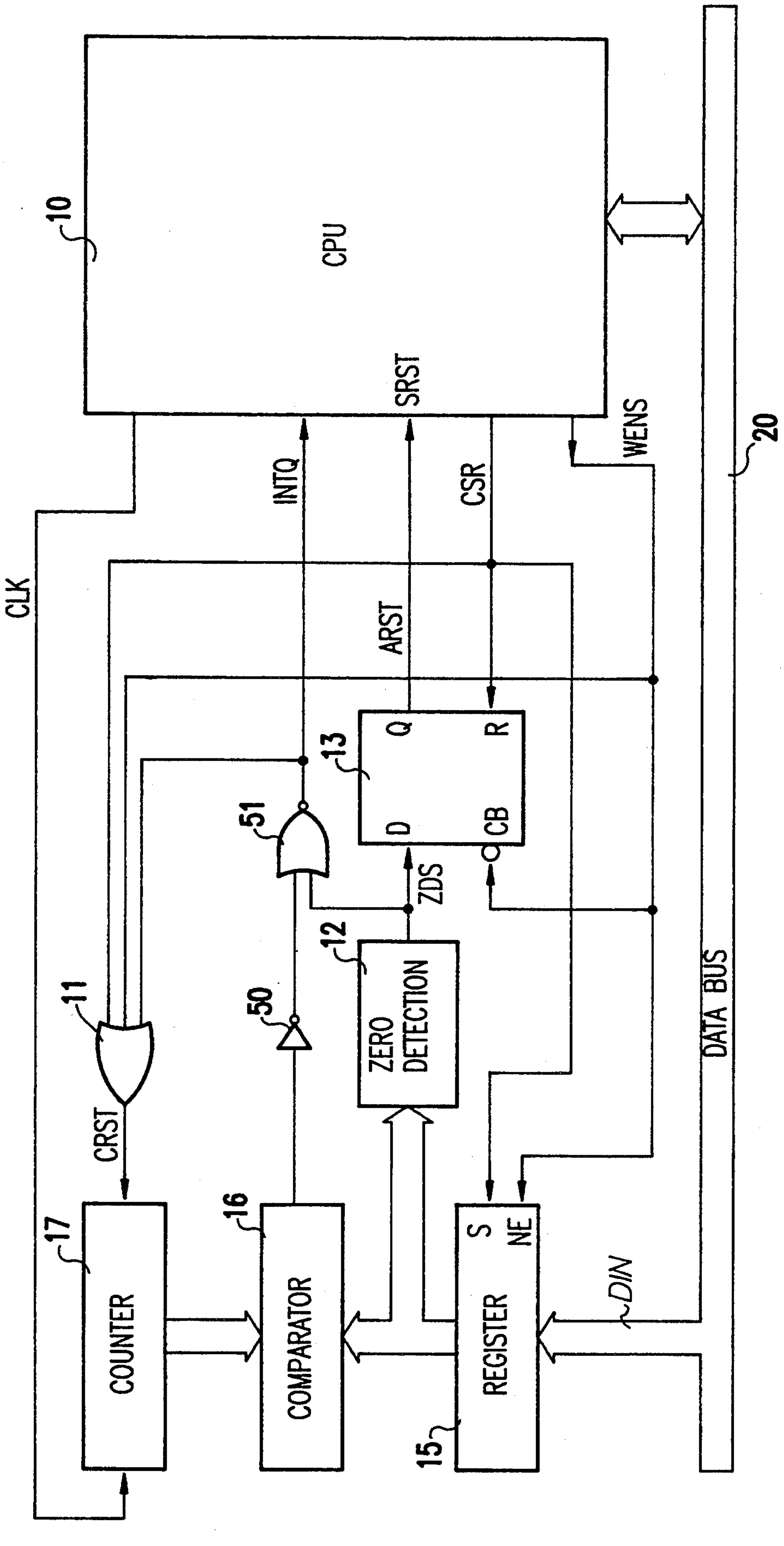
FIG. 5 is a block diagram illustrative of a microcomputer including a timer circuit according to a third embodiment of the present invention.

In general a microcomputer includes a system reset function. Specifically, the microcomputer initializes its internal states in response to a system reset signal and further generates a system reset command signal to peripheral units to initialize them. The register 15 can be thus set by employing the system reset function. A circuit construction for this purpose is shown in FIG. 5 as a third embodiment of the present invention in which the same constituents as those shown in FIG. 1 are denoted by the same reference numerals to omit the further description thereof.

In this embodiment, the output signal ARST derived from the latch circuit 13 is supplied to a system reset terminal SRST of the CPU 10 which in turn responds to the active high level signal ARST and generates a system reset command signal CRS. This signal CSR is supplied to the OR gate 11, the reset terminal R of the latch circuit 13 and the set terminal S of the register 15. Accordingly, When the data of "00H" is written into the register 15, the signal ARST is changed to the active high level to cause the CPU 10 to generate the system reset command signal CSR. The data stored in the register 15 is thereby changed from "00H" to "FFH" and the counter 17 and the latch circuit 13 are brought into the reset condition. The CPU 10 is also initialized.

Further in the present embodiment, an inverter 50 and a NOR gate 51 are provided. The NOR gate 51 receives the output of the comparator 16 via the inverter 50 and the zero detection signal ZDS. The output of the NOR gate 51 is supplied to the CPU 10 as an interrupt request signal INTQ. Accordingly, even when the comparator 16 generates the high level output due to the fact that the data of "00H" is written into the register 15, the output of the NOR gate 51, i.e. the interrupt request signal INTQ, is held at the low level by the detection signal ZDS. ON the other hand, the high level output derived from the comparator 16 in a normal operation changes the interrupt request signal INTQ to the active high level through the inverter 50 and the NOR gate 51. The generation of the undesired interrupt request signal INTQ is thus prevented. Also in this embodiment, the detection circuit 12 can replaced with the comparator and the AND gate as shown in FIG. 4.

It is apparent that the present invention is not limited to the above embodiments but may be modified and changed without departing from the scope and spirit of the invention. For example, the timer circuit according to the present invention is applicable to any other apparatus than a microcomputer.

What is claimed is:

1. A timer circuit comprising a counter counting a clock signal, a register temporarily storing data, a comparator comparing a count value of said counter with data stored in said register and producing a coincident signal when the count value of said counter is coincident with the data stored in the register, detection means for detecting data stored in sid register and producing a detection signal when said register is written with data indicative of value that is equal to a initial value of said counter, and changing means responsive to said detection signal for changing a value of the data stored in said register to another value that is different from said initial value of said counter.

2. The timer circuit sa claimed in claim 1, wherein said register stores data supplied thereto in response to a write-enable signal and said counter is reset to said initial value in response to said write-enable signal.

3. The timer circuit as claimed in claim 2, wherein said detection means includes a gate circuit decoding the data stored in said register to detect that the value of the data stored in said register is equal to said initial value of said counter.

4. The timer circuit sa claimed in claim 2, wherein said detection means includes a gate circuit detecting that said register is written with data indicative of the value equal to said initial value of said counter when both of said write-enable signal and said coincident signal are produced.

5. The timer circuit as claimed in claim 2, wherein said register includes a set terminal and setting means responsive to an active level at said set terminal for setting a content of data stored in said register to said value different from said initial value of said counter, said changing means including means responsive to said detection signal for applying said active level to said set terminal of said register.

6. The timer circuit as claimed in claim 2, further comprising a logic gate supplied with an output of said comparator, said logic gate inhibiting said coincident signal from passing therethrough when said detection signal is produced and allowing said coincident signal to pass therethrough when said detection signal is not produced.

7. A timer circuit comprising a counter counting a clock signal, a register temporarily storing data, interrupt request means for supplying an interrupt request signal to a data processing unit when a count value of said counter reaches a value represented by the data stored in said register, detection means for producing a detection signal when said register is written with data indicative of a value that is equal to an initial value of said counter, and means responsive to said detection signal for issuing a system reset request to said data processing unit, said data processing unit responding to said system reset request to generate a command signal to said register to cause said register to change data stored therein to another data having a value different form said initial value of said counter.

8. The timer circuit as claimed in claim 7, wherein said interrupt request means includes a comparator producing a coincident signal when the count value becomes equal to a value represented by the data stored said register and a gate circuit responding to said coincident signal to supply said interrupt request signal when said register stores data indicative of a value different from said initial value of said counter.

* * * * *